(12) United States Patent
Kimpel et al.

(10) Patent No.: US 12,213,292 B2
(45) Date of Patent: Jan. 28, 2025

(54) COOLING OF SEMICONDUCTORS FOR OPTIMISED SERVICE LIFE

(71) Applicant: Siemens Aktiengesellschaft, Munich (DE)

(72) Inventors: Jürgen Kimpel, Erlangen (DE); Bernd Roppelt, Unterhaid (DE); Jens Schmenger, Forchheim (DE); Thomas Schwinn, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 18/684,516

(22) PCT Filed: Jun. 8, 2022

(86) PCT No.: PCT/EP2022/065503
§ 371 (c)(1),
(2) Date: Feb. 16, 2024

(87) PCT Pub. No.: WO2023/020729
PCT Pub. Date: Feb. 23, 2023

(65) Prior Publication Data
US 2024/0268087 A1    Aug. 8, 2024

(30) Foreign Application Priority Data
Aug. 17, 2021    (EP) .................................... 21191731

(51) Int. Cl.
*H05K 7/20* (2006.01)

(52) U.S. Cl.
CPC ..... *H05K 7/20945* (2013.01); *H05K 7/20909* (2013.01); *H05K 7/20927* (2013.01)

(58) Field of Classification Search
CPC ............... G05B 15/02; H05K 7/20945; H05K 7/20909; H05K 7/20927
(Continued)

(56) References Cited

U.S. PATENT DOCUMENTS

| 7,383,520 B2 * | 6/2008 | Chandra | ............ H05K 7/20209 716/132 |
| 9,753,442 B2 * | 9/2017 | Lim | ...................... G11B 19/046 |

(Continued)

FOREIGN PATENT DOCUMENTS

| DE | 102009042631 A1 * | 3/2011 | ......... H05K 7/20281 |
| DE | 102017200088 A1 * | 7/2018 | ................ B60L 1/02 |

(Continued)

OTHER PUBLICATIONS

PCT International Search Report and Written Opinion of International Searching Authority mailed Sep. 28, 2022 corresponding to PCT International Application No. PCT/EP2022/065503 filed Jun. 8, 2022.

*Primary Examiner* — Ronald D Hartman, Jr.
(74) *Attorney, Agent, or Firm* — Henry M. Feierelsen LLC

(57) ABSTRACT

In a method for cooling a semiconductor, a time profile of a load of the semiconductor is determined over a predefinable period of time. A cooling apparatus for cooling the semiconductor is controlled or regulated depending on a load cycle of the semiconductor resulting from the determined time profile of the load, and the cooling apparatus is controlled or regulated as a function of the load averaged over the predefinable period of time.

15 Claims, 1 Drawing Sheet

(58) Field of Classification Search
USPC .......................................................... 700/300
See application file for complete search history.

(56) References Cited

U.S. PATENT DOCUMENTS

| | | | | |
|---|---|---|---|---|
| 2008/0163135 | A1* | 7/2008 | Chandra | H05K 7/20209 |
| | | | | 716/132 |
| 2016/0062326 | A1* | 3/2016 | Bang | G06F 1/206 |
| | | | | 700/299 |
| 2018/0053668 | A1* | 2/2018 | Mimura | G05D 23/1934 |
| 2018/0286557 | A1* | 10/2018 | Chen | H05K 7/20209 |
| 2019/0223330 | A1 | 7/2019 | Chen et al. | |
| 2020/0336618 | A1* | 10/2020 | Kadobayashi | G05D 23/1917 |
| 2023/0152035 | A1* | 5/2023 | Jackson | G05B 19/4155 |
| | | | | 700/297 |

FOREIGN PATENT DOCUMENTS

| | | | | | |
|---|---|---|---|---|---|
| DE | 102019100438 | A1 | * | 7/2019 | ............ B60L 15/007 |
| EP | 3411887 | A1 | * | 12/2018 | ........... G05B 19/408 |
| KR | 20190092172 | A | * | 1/2018 | ............. F25B 49/02 |
| WO | WO-2017132981 | A1 | * | 8/2017 | ........... G05B 19/408 |

\* cited by examiner

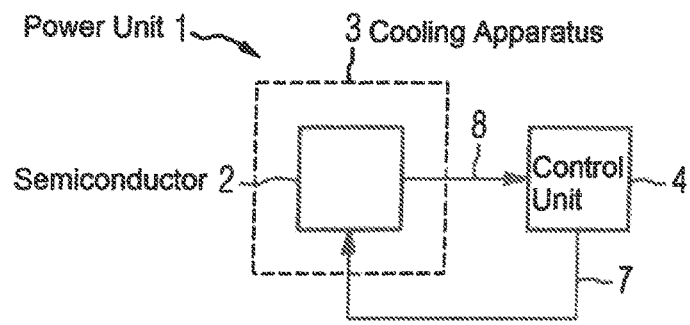
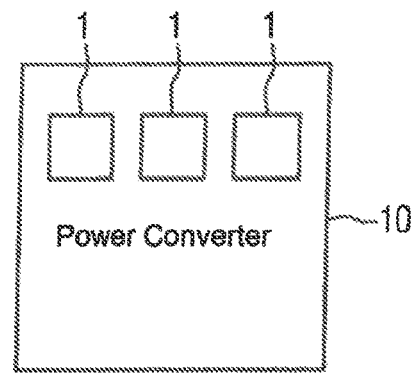
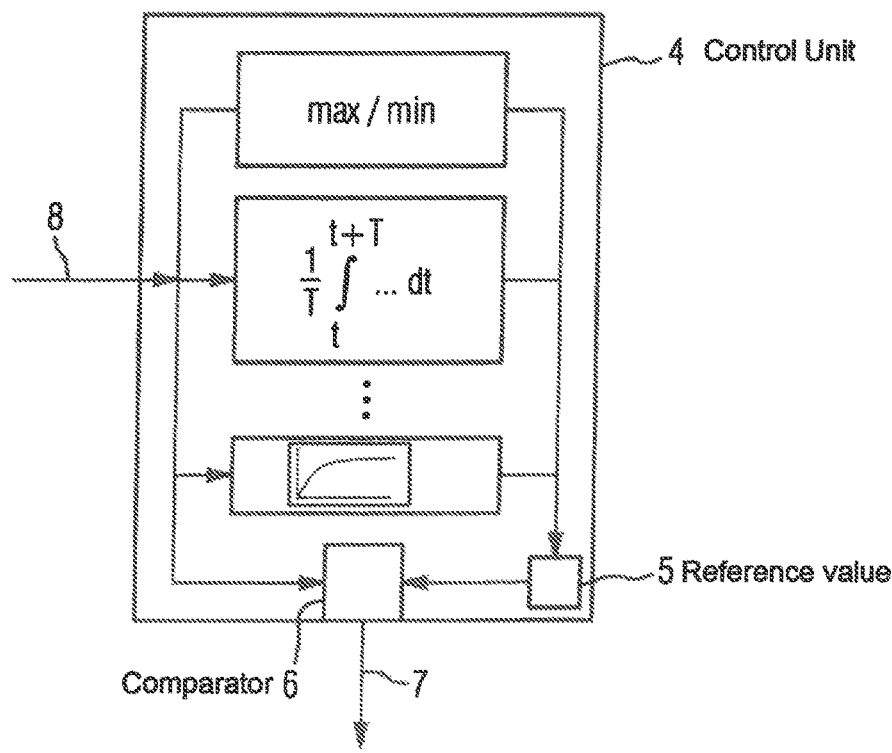

COOLING OF SEMICONDUCTORS FOR OPTIMISED SERVICE LIFE

CROSS-REFERENCES TO RELATED APPLICATIONS

This application is the U.S. National Stage of International Application No. PCT/EP2022/065503, filed Jun. 8, 2022, which designated the United States and has been published as International Publication No. WO 2023/020729 A1 and which claims the priority of European Patent Application, Ser. No. 21/191,731.5, filed Aug. 17, 2021, pursuant to 35 U.S.C. 119 (a)-(d).

BACKGROUND OF THE INVENTION

The invention relates to a method for cooling at least one semiconductor. The invention also relates to a power unit with at least one semiconductor, a cooling apparatus for cooling the at least one semiconductor and a control unit, the cooling power of the cooling apparatus being controllable. The invention further relates to a power converter having at least one such power unit.

The cooling of semiconductors has the task of dissipating the heat generated during operation on account of electrical losses from the semiconductors. The aim is to operate the semiconductor within its permissible temperature values during operation. A typical value for a temperature limit value represents the junction temperature of the semiconductor which must not be exceeded, as otherwise there is a risk of failure in which the semiconductor can be destroyed.

A temperature value is usually used for monitoring. As the junction temperature is not readily measurable in a simple way, a temperature limit for a measured temperature is converted. Alternatively, it is possible to calculate the junction temperature from the measured temperature with the aid of a temperature model.

If the measured temperature exceeds the converted temperature limit value or the junction temperature determined via the temperature model exceeds the limit value for the junction temperature, a protective reaction such as, for example, a power reduction or a shutdown of the semiconductor or the power converter constructed therewith is triggered.

Today, some semiconductors and power converters constructed therefrom are designed with oversizing in order to prevent limit values from being exceeded and to ensure a long service life. This frequently leads to oversized semiconductor chips in the semiconductors. In addition, a worst-case scenario is used for the design, which ensures that the temperature limits can be maintained under the permissible operating conditions.

A semiconductor is subject to a load during its operation, inter alia, due to the resulting temperatures. The time profile of the load is also referred to as a load cycle. In particular, this time profile is also referred to as a load cycle if this load is cyclical, that is to say recurring.

The object of the invention is to improve the cooling of semiconductors.

SUMMARY OF THE INVENTION

This object is achieved by a method for cooling at least one semiconductor as set forth hereinafter. Furthermore, this object is achieved by a power unit, having at least one semiconductor, a cooling apparatus for cooling the at least one semiconductor and a control unit, the cooling power of the cooling apparatus being controllable, the control unit being set up to control or regulate the cooling power of the cooling apparatus by means of such a method. Furthermore, this object is achieved by a power converter with at least one such power unit.

Further advantageous embodiments of the invention are specified in the dependent claims.

The invention is based, inter alia, on the knowledge that the service life of a semiconductor, a power unit and/or a power converter can be extended if the cooling of the semiconductor can be changed and this is controlled or regulated depending on a load cycle of the semiconductor. It has been found that in semiconductors, in particular in power semiconductors such as IGBT modules, the chip temperature difference is a major limiting parameter for the service life and the design of the semiconductor due to the internal design technology. A reduction of the temperature increases over the load cycle leads to an extension of the service life and thus to an improvement in cooling.

The load on the semiconductor is determined over a predefinable period of time. The load cycle on which the regulation or control is based is then obtained from this specific load.

For this purpose, the control unit advantageously evaluates the load cycles of the semiconductor, the power unit or the power converter. This can be done, for example, on the basis of the currents, the powers, power losses, temperatures or other recorded or calculated variables. With knowledge of the load cycle or the load cycles, for example, the heat sink temperature in the vicinity of one or more semiconductors can be influenced. This then also affects the temperature of the semiconductor. In order to control the heat sink temperature, in the case of air cooling, for example, the fan speed can be changed. In the case of liquid cooling, for example, the flow rate or the temperature of the cooling medium can be used to control or regulate the cooling apparatus. The regulation or control of the cooling medium can have a positive effect on the service life of the semiconductor if a more constant heat sink temperature is achieved by control or regulation and as a result the increase in temperature on the semiconductor or the speed of the change in temperature on the semiconductor is reduced. Alternatively or additionally, the regulation or control of the cooling apparatus can also be used to reduce the number of increases in temperature on the semiconductor. For this purpose, for example, the fan speed can not only be increased or even significantly increased, for example to a maximum value, in the event of an overload of the semiconductor, in order to counteract a rise in temperature, in particular of the heat sink or of the semiconductor, but it has also proven useful to reduce the fan speed in the case of a low load on the semiconductor in order to avoid excessive cooling of the heat sink or the semiconductor. This ensures that the temperature on the heat sink or on the semiconductor is kept as constant as possible in order to reduce the fluctuation range of the increases in temperature and/or to reduce the number of increases in temperature.

The control or regulation of the heat sink temperature with its influence on the semiconductor temperature is carried out particularly efficiently in the case of a heat sink with forced convection by varying the fan control. In this case, the current, in particular the actual current, through the semiconductor, the intermediate circuit voltage of the power converter and/or the output frequency of the power converter can be taken into account as further input variables for the regulation or control of the cooling apparatus. This not only achieves a long service life, but the cooling can also take into account the current operating state of the semiconductor or the power converter and thus generate a cooling which not only has a life-extending effect, but also takes into account the current operating state, and thus protects against short-term overload.

With the information from the load cycle, which is detected and evaluated by the control unit, a pilot control of the temperature of the heat sink or the semiconductor via the fan speed can be carried out, for example, according to a detected load cycle pattern, and thus the heat sink can be kept at a relatively constant temperature. This temperature, which is as constant as possible, has only a small fluctuation range in the increases in temperature. Increases in temperature occurring otherwise can even be completely eliminated, so that the number of increases in temperature is also reduced. This requires a lower increase in temperature on the semiconductor, in particular in the case of the junction temperature, as well as a lower number of increases in temperature. Both the lower range of fluctuation and the lower number of increases in temperature leads to a longer service life of the semiconductor and thus also to a longer service life of the devices constructed therefrom such as, for example, a power converter.

The advantage is particularly favorable in the case of longer load cycles whose overload or overloads are in a period of time in the range of 1 to 5 minutes. This period of time is dependent on the thermal properties of the heat sink used, such as, for example, its thermal mass.

A further application is the targeted pilot control of the cooling in the case of short load cycles in the range of 5 to 20 s, which do not generate large peaks in the power losses. During these times, the fan speed can be increased in order to lower the heat sink temperature without increases in temperature being generated due to power loss peaks in the semiconductor. The lower heat sink temperature, and subsequently the lower temperature of the semiconductor, lead to a longer service life of the semiconductor. This effect is particularly positive in the case of power semiconductors such as, for example, an IGBT module.

Through the targeted pilot control of the temperature of the heat sink or the semiconductor, a reduction in power due to short-term power peaks and associated temperatures can be counteracted in a targeted manner in the event of overloads and consequently high heat sink temperatures, as the corresponding components or the device do not go into derating.

Thus, it has been found to be advantageous to pre-control and operate the fan as a function of the load cycle, in particular on the basis of the detected, recurring load cycle, for example as a function of the measured and/or evaluated heat sink temperature or semiconductor temperature, when the pulse of the power converter is released. In contrast to operation at nominal speed, the increases in temperature can thus be reduced. This results in a longer service life of the semiconductor, in particular with a power module such as an IGBT module. These modules usually define the service life of the devices constructed therefrom, such as, for example, a power converter. At the same time, the application of the proposed method enables a higher utilization of the devices and, consequently, of the associated systems. As a result of the reduced cooling power, energy savings can also be achieved in the cooling apparatus. This is because the average heat sink temperature may be higher depending on the load cycle traveled, without adversely affecting the service life.

In an advantageous embodiment of the invention, the current through the semiconductor is measured, the load on the semiconductor being ascertained from the current through the semiconductor and the switching frequency of the semiconductor. Substantial loss factors of the semiconductor result from the sum of forward losses and switching losses. The forward losses can be determined linearly as a function of the current and/or as a square of the current. The switching losses can be stored in the data sheet as a function of the switching frequency in the control unit of the semiconductor and are then available for calculation. Alternatively, it is also possible to determine the switching losses by assuming that they are identical to the forward losses. In the design of semiconductors for intended operation, it has been found to be useful to operate the semiconductor in such a way that forward losses and switching losses are identical over a wide working range.

In an advantageous embodiment of the invention, the cooling apparatus is controlled or regulated as a function of the load averaged over the predefinable period of time. Averaging the load on the power converter has the advantage that the cooling power only changes moderately. As the change in cooling power is often also accompanied by a change in noise, the noise generation can be made more pleasant. This increases customer acceptance of an electrical component constructed from this power unit, such as, for example, a power converter. As a result, sales opportunities and thus also sales figures can be increased. In addition, such a component is more environmentally friendly due to the optimized noise generation.

In a further advantageous embodiment of the invention, the cooling apparatus is controlled in such a way that the fluctuation range of a temperature fluctuation on the semiconductor is reduced, Reducing the range of fluctuations in temperature has proven to be a particularly effective method of extending the service life. This can be done by significantly increasing the cooling, in particular in the event of a deviation in the semiconductor temperature from a target value if the semiconductor temperature deviates upward from the target value. Otherwise, if the semiconductor temperature deviates downward, the cooling can be significantly reduced. In an evaluation of the load cycle and thus known future load behavior, the regulation or control can intervene in such a way that the temperature remains constant or at least almost constant while adhering to the predicted load behavior.

In a further advantageous embodiment of the invention, a reference value is ascertained from the load cycle, the cooling power of the cooling apparatus being controlled as a function of the difference between the instantaneous load on the semiconductor and the reference value. The reference value is suitable for ascertaining a target value for heating the semiconductor or the heat sink. In this case, the reference value can represent a mean value from the load cycle and thus, for example, an average load. The reference value represents, for example, the load averaged over a certain time. As a target value, the semiconductor temperature can then assume a temperature which results under constant load with the average load. If the load deviates from the average load in the load cycle, the power of the cooling apparatus is changed in such a way that the temperature changes only slightly. Thus, at a higher instantaneous load than the average load, the cooling power is increased, otherwise reduced. This results in a particularly low fluctuation range of the semiconductor temperature fluctuation. This leads to a high gain in service life for the semiconductor.

In the case of a periodic load cycle, a mean value formation of the load, which is averaged over the period duration of the load cycle, is provided as a reference value.

This results in a particularly accurate target value for the temperature of the semiconductor or the heat sink with a particularly low range of fluctuation of this temperature. This results in a particularly long service life.

However, if the load cycle is not periodic or has portions with different period durations or if the period duration is not known or cannot be ascertained, then a smoothing of the load is appropriate in order to judge whether the semiconductor is in a higher load phase. In this case, the reference value can be ascertained by smoothing the load. This can be done, for example, with a PT1 element. For unknown loads, changing loads or non-periodic loads, smoothing provides an effective instrument for reducing the fluctuation range of the temperature fluctuations and ensuring a long service life of the semiconductor.

In a further advantageous embodiment of the invention, the cooling power of the cooling apparatus is increased when there is a positive difference between the instantaneous load on the semiconductor and the reference value, and the cooling power of the cooling apparatus is reduced at a predetermined rate of change when there is a negative difference between the instantaneous load on the semiconductor and the reference value. Such a reaction keeps the fluctuation range of the temperature fluctuation low and can be implemented particularly easily by means of known controllers such as, for example, a controller with P-portion. This controller can also be extended by an I-portion and/or a D-portion. Such a control can be used easily and effectively in a control facility with which an increase in service life can be achieved.

The predetermined rate of change provides the opportunity to react slowly to a lower cooling requirement. As this does not have a negative effect on the service life, it can be selected in such a way that the change takes place only slowly. As noise generation is usually associated with cooling as a function of the cooling power, the change in noise can be reduced. This is often perceived as more pleasant than sudden or abrupt changes in noise generation. This improves acceptance by the user and increases the sales opportunities and thus the quantities sold. This effect is particularly noticeable in the case of air cooling as the air flow can cause noise generation.

In a further advantageous embodiment of the invention, the reference value is ascertained from a mean value formation, in particular a weighted mean value formation, or from a smoothing of the instantaneous load. As already described, the formation of the reference value for a periodic load cycle is particularly effective as it allows the fluctuation range of the temperature fluctuation to be reduced to a large extent. However, if the period duration is not known or ascertainable or the load cycle is not periodic or changes frequently, the formation of the reference values by smoothing the load, for example, by means of a PT1 element, is a particularly effective method of keeping the fluctuation range of the temperature fluctuation low and achieving a long service life.

In a further advantageous embodiment of the invention, in the case of a recurring load cycle, a mean value is formed over the period duration of the recurring load or the smoothing takes place with a time constant in the region of the period duration. Recurring load cycles have the advantage that future behavior can be predicted particularly accurately. Therefore, the mean value formation over the period duration of the periodic load cycle or the smoothing can be carried out with a time constant in the order of magnitude of the period duration. As a result, the range of fluctuation is particularly low and the service life is particularly long.

In a further advantageous embodiment of the invention, the cooling apparatus is designed as air cooling and the cooling power is increased by increasing a fan speed. Increasing the fan speed is particularly easy to implement with air cooling and at the same time represents a highly effective opportunity to influence the cooling apparatus. The manipulated variable requires little energy for the control or regulation of the cooling apparatus, so that this operates efficiently and with low energy consumption and at the same time allows a long service life to be achieved.

In a further advantageous embodiment of the invention, the cooling apparatus is designed as liquid cooling and the cooling power is increased by increasing a cooling medium flow rate and/or by reducing the temperature of the cooling medium. Increasing the cooling medium flow rate or reducing the cooling medium temperature is particularly easy to achieve with liquid cooling and at the same time represents a highly effective opportunity to influence the cooling apparatus. The manipulated variable requires little energy for the control or regulation of the cooling apparatus, so that this operates efficiently and with low energy consumption and at the same time allows a long service life to be achieved.

In a further advantageous embodiment of the invention, the minimum and the maximum load on the semiconductor is ascertained from the load cycle, the cooling power being controlled in the range of 0 to 20% of the nominal cooling capacity when the instantaneous load on the semiconductor reaches the minimum load and the cooling power being controlled in the range of 100 to 200% of the nominal cooling capacity when the instantaneous load on the semiconductor reaches the maximum load. This ensures that a high actuating reserve is available for influencing the temperature fluctuation on the semiconductor and/or heat sink and counteracts a change in temperature. The maximum actuating reserve, optionally minus a safety distance, is used in such a way that the maximum actuating reserve is also used for the maximum and minimum deviation from the reference value. As a result, the fluctuation range of the temperature can be kept particularly low and partial temperature fluctuation can already be completely eliminated.

In a further advantageous embodiment of the invention, a future load on the semiconductor is ascertained from the load cycle, the cooling power of the cooling apparatus being increased before the occurrence of an increasing load, which is detected on the basis of the ascertained future load. A future load can be calculated, determined or at least estimated, particularly in the case of periodic load cycles or recurring load cycles. The future temperature behavior can also be determined from this future load. This temperature behavior can be controlled by influencing the cooling apparatus. If an increasing future load is predicted, the cooling power can be increased. In the case of a decreasing future load, the cooling power can be reduced. As there is a certain time delay between the intervention of the control apparatus and the effect on the temperature, by ascertaining the future load, the control intervention can take place early such that temperature fluctuations are effectively suppressed even with little control intervention, i.e. small manipulated variables, and turn out to be particularly low. A particularly long service life can thus be achieved.

In a further advantageous embodiment of the invention, the cooling power is controlled to a maximum value at a time, so that when the load occurs, as it results from the previously ascertained future load on the semiconductor, it is operated within its permissible temperature range. In the event of high loads in the future load, this information can be used to avoid protective shutdowns. If a high load is apparent, which leads to temperature limit values being exceeded in the semiconductor, this can already be detected at an early stage by ascertaining the short-term load in such a way that the cooling power is regulated or controlled to a maximum value at an early stage. This takes place at an early stage in such a way that heat stored in the heat sink is dissipated to the environment in order to absorb a particularly high amount of heat from the semiconductor. In this case, although the control does not necessarily increase the service life, it can maintain the operation of the semiconductor or the power converter even under a high load or even in the event of overloading. This leads to particularly high availability of the semiconductor or the power converter.

In a further advantageous embodiment of the invention, the cooling power is controlled in such a way that on average a cooling power of at least the nominal cooling capacity, in particular exactly the nominal cooling capacity, is obtained. This operation ensures that the cooling apparatus is utilized well and thus, in addition to small temperature fluctuations, also keeps the applied temperature on the semiconductor low, which likewise has an effect on the service life. This is also a life-extending measure, which at the same time means that the semiconductor and the power converter are utilized well and have no or only slight oversizing. These components can thus be produced at a favorable price/performance ratio.

BRIEF DESCRIPTION OF THE DRAWING

The invention is explained in more detail hereinafter with reference to the exemplary embodiments shown in the figures. It is shown in:

FIG. 1 a power unit,
FIG. 2 a power converter, and
FIG. 3 a functional representation of the control unit.

DETAILED DESCRIPTION OF PREFERRED EMBODIMENTS

FIG. 1 shows a power unit 1 with a semiconductor 2 and a cooling apparatus 3 for cooling the semiconductor 2 and a control unit 4. The power unit 1 can also have a plurality of semiconductors 2. For example, in the case of a power unit 1 for a power converter 10 (not shown here), it has proven favorable to arrange six semiconductors 2 in one power unit 1, the six semiconductors 2 forming a bridge circuit. As the six semiconductors 2 of a power converter 10 experience almost the same load, it is advantageous if they are cooled by exactly one cooling apparatus 3.

To control or regulate the cooling apparatus 3, measured values 8 are recorded by the semiconductor 2. Information about the load cycle can be taken from the time profile of the measured values 8. The load cycle, which reflects the load on the semiconductor 2, is then used to control or regulate the cooling apparatus 3. For this purpose, for example, one or more measured values 8 from the semiconductor 2 are recorded and evaluated by a control unit 4. After processing, an output signal 7 of the control unit 4 is generated and fed to the cooling apparatus 3, so that the cooling apparatus 3 is controlled or regulated as a function of the load cycle of the semiconductor 2.

FIG. 2 shows a power converter 10 with a multiplicity of power units 1, three in this exemplary embodiment. The power units can, for example, in each case form one phase of a three-phase power converter 10 and thus have exactly two semiconductors 2.

FIG. 3 shows a functional design of the control unit 4, which makes it possible to control or regulate the cooling apparatus 3 (not shown here) as a function of the load cycle of the semiconductor 2. Measured values 8 on the semiconductor 2 or the power converter 10 are recorded and processed by the control unit 4. The processing can include, for example, the ascertaining of maximum and minimum values. Furthermore, as an alternative or in addition, a mean value formation, in particular a mean value formation via weighted variables, can take place. In addition or alternatively, the measured values can also be smoothed, for example, with a PT1 element and an associated time constant. A reference value 5 is then generated from the different calculation options. This reference value is compared in a comparator 6 with the instantaneous load resulting from the measured values 8. Depending on the magnitude of the deviation of the instantaneous load from the reference value, an output signal 7 is generated for controlling or regulating the cooling apparatus 3.

In summary, the invention relates to a method for cooling at least one semiconductor. To improve cooling with regard to the service life of the semiconductor, it is proposed that, depending on a load cycle of the semiconductor, a cooling apparatus for cooling the at least one semiconductor is controlled. Specifically, to improve cooling with regard to the service life of the semiconductor, it is proposed that the time profile of the load on the semiconductor is determined over a predefinable period of time, a cooling apparatus 3 for cooling the at least one semiconductor 2 being controlled or regulated as a function of a load cycle resulting from the determined time profile of the load on the semiconductor 2. The invention also relates to a power unit, comprising at least one semiconductor, a cooling apparatus for cooling the at least one semiconductor and a control unit, the cooling power of the cooling apparatus being controllable, and the control unit being designed to control or regulate the cooling power of the cooling apparatus by means of such a method. The invention further relates to a power converter having at least one such power unit.

The invention claimed is:

1. A method for cooling a semiconductor, the method comprising:
   determining a time profile of a load of the semiconductor over a predefinable period of time;
   controlling or regulating a cooling apparatus for cooling the semiconductor depending on a load cycle of the semiconductor resulting from the determined time profile of the load; and
   controlling or regulating the cooling apparatus as a function of the load averaged over the predefinable period of time.

2. The method of claim 1, further comprising:
   measuring the current through the semiconductor; and
   determining the load on the semiconductor from the current through the semiconductor and a switching frequency of the semiconductor.

3. The method of claim 1, wherein the cooling apparatus is controlled in such a way that a fluctuation range of a temperature fluctuation on the semiconductor is reduced.

4. The method of claim 1, further comprising
   ascertaining a reference value from the load cycle; and
   controlling a cooling power of the cooling apparatus as a function of a difference between an instantaneous load on the semiconductor and the reference value.

5. The method of claim 4, wherein, when the difference between the instantaneous load of the semiconductor and the reference value is positive, the cooling power of the cooling apparatus is increased, and when the difference between the instantaneous load of the semiconductor and the reference value is negative, the cooling power of the cooling apparatus is reduced at a predetermined rate of change.

6. The method of claim 4, wherein the reference value is ascertained from a mean value formation, in particular a weighted mean value formation, or from a smoothing of the instantaneous load.

7. The method of claim 6, further comprising, when the load cycle is recurring, forming a mean value over a period of the recurring load or effecting the smoothing with a time constant in a region of the period.

8. The method of claim 1, further comprising:
designing the cooling apparatus as air cooling; and
increasing a cooling power of the cooling apparatus by increasing a fan speed.

9. The method of claim 1, further comprising:
designing the cooling apparatus as liquid cooling; and
increasing a cooling power by increasing a cooling medium flow rate and/or by reducing a temperature of the cooling medium.

10. The method of claim 1, further comprising:
ascertaining a minimum load and a maximum load of the semiconductor from the load cycle;
controlling a cooling power of the cooling apparatus in a range of 0 to 20% of a nominal cooling capacity when an instantaneous load of the semiconductor reaches the minimum load; and
controlling the cooling power of the cooling apparatus in a range of 100 to 200% of the nominal cooling capacity when the instantaneous load of the semiconductor reaches the maximum load.

11. The method of claim 1, further comprising:
ascertaining a future load on the semiconductor from the load cycle; and
increasing a cooling power of the cooling apparatus before occurrence of an Increasing load, which is detected based on the ascertained future load.

12. The method of claim 11, further comprising controlling the cooling power to a maximum value at a time, so that when the load occurs, as it results from a previously ascertained future load on the semiconductor, the semiconductor is operated within its permissible temperature range.

13. The method of claim 1, further comprising controlling a cooling power in such a way that on average a cooling power of at least the nominal cooling capacity, in particular exactly the nominal cooling capacity, is obtained.

14. A power unit, comprising:
a semiconductor;
a cooling apparatus designed to cool the semiconductor; and
a control unit designed to control or regulate a cooling power of the cooling apparatus by determining a time profile of a load of the semiconductor over a predefinable period of time, controlling or regulating the cooling apparatus for cooling the semiconductor depending on a load cycle of the semiconductor resulting from the determined time profile of the load, and controlling or regulating the cooling apparatus as a function of the load averaged over the predefinable period of time.

15. A power converter, comprising a power unit as set forth in claim 14.

* * * * *